United States Patent
Koizumi

(10) Patent No.: US 7,071,567 B2
(45) Date of Patent: Jul. 4, 2006

(54) SEMICONDUCTOR DEVICE AND METHOD OF FABRICATION THEREOF, OPTICAL MODULE AND METHOD OF FABRICATION THEREOF, CIRCUIT BOARD, AND ELECTRONIC INSTRUMENT

(75) Inventor: Masanori Koizumi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 173 days.

(21) Appl. No.: 10/687,548

(22) Filed: Oct. 15, 2003

(65) Prior Publication Data

US 2004/0142539 A1 Jul. 22, 2004

(30) Foreign Application Priority Data

Oct. 15, 2002 (JP) .............................. 2002-300265

(51) Int. Cl.
*H01L 23/52* (2006.01)
(52) U.S. Cl. .................. 257/777; 257/432; 257/434; 257/686; 257/723
(58) Field of Classification Search ........ 257/431–435, 257/680, 686, 692, 723–724, 777
See application file for complete search history.

(56) References Cited

U.S. PATENT DOCUMENTS

| 6,147,401 | A  * | 11/2000 | Solberg ...................... 257/723 |
| 6,486,544 | B1 * | 11/2002 | Hashimoto .................. 257/686 |
| 6,576,992 | B1 * | 6/2003  | Cady et al. ................. 257/686 |
| 6,727,431 | B1 * | 4/2004  | Hashimoto ................. 174/52.2 |
| 6,765,236 | B1 * | 7/2004  | Sakurai ....................... 257/98 |
| 6,765,288 | B1 * | 7/2004  | Damberg .................... 257/698 |

FOREIGN PATENT DOCUMENTS

JP 04-028260 1/1992

* cited by examiner

Primary Examiner—Luan Thai
(74) Attorney, Agent, or Firm—Hogan & Hartson, L.L.P.

(57) ABSTRACT

A semiconductor device includes: a substrate on which is formed an interconnecting pattern; a first semiconductor chip provided above the substrate and having a first electrode on a surface facing the substrate; and a second semiconductor chip provided above the first semiconductor chip and having a second electrode on a surface facing the substrate. The substrate has a bent portion inclined from the first electrode to the second electrode. The interconnecting pattern extends along the bent portion and electrically connected to the first and second electrodes.

10 Claims, 7 Drawing Sheets

SEMICONDUCTOR DEVICE AND METHOD OF FABRICATION THEREOF, OPTICAL MODULE AND METHOD OF FABRICATION THEREOF, CIRCUIT BOARD, AND ELECTRONIC INSTRUMENT

Japanese Patent Application No. 2002-300265, filed on Oct. 15, 2002, is hereby incorporated by reference in its entirety.

BACKGROUND OF THE INVENTION

The present invention relates to a semiconductor device and a method of fabrication thereof, an optical module and a method of fabrication thereof, a circuit board, and also an electronic instrument.

A stack-type of semiconductor device is known in which a plurality of semiconductor chips are deposited in a stack on a substrate. Since this enables the integration of a plurality of semiconductor chips, it makes it possible to reduce the area occupied on the substrate and thus enables designs for smaller products. A stack-type semiconductor device of the prior art generally makes use of wire-bonding techniques, but the use of wires imposes a limit on efforts to make the resultant components thinner and more compact. In particular, image-capturing devices that have optical chips are required to be thinner and more compact.

BRIEF SUMMARY OF THE INVENTION

According to one aspect of the present invention, there is provided a semiconductor device comprising:

a substrate on which is formed an interconnecting pattern;

a first semiconductor chip provided above the substrate and having a first electrode on a surface facing the substrate; and a second semiconductor chip provided above the first semiconductor chip and having a second electrode on a surface facing the substrate, wherein the substrate has a bent portion inclined from the fist electrode to the second electrode, and wherein the interconnecting pattern extends along the bent portion and is electrically connected to the first and second electrodes.

According to another aspect of the present invention, there is provided an optical module comprising:

a substrate on which is formed an interconnecting pattern and an aperture portion;

an optical chip provided above the substrate and having an optical portion and a first electrode on a surface facing the substrate, the optical portion being disposed so as to face the aperture portion; and a circuit chip provided above the optical chip and having a second electrode on a surface facing the substrate;

wherein the substrate has a bent portion inclined from the first electrode to the second electrode; and wherein the interconnecting pattern extends along the bent portion and is electrically connected to the first and second electrodes.

According to a further aspect of the present invention, there is provided an optical module comprising:

a first circuit chip having a first electrode on the front surface of the first circuit chip;

a second circuit chip having a second electrode on the front surface of the second circuit chip, the rear surface of the second circuit chip being affixed to the rear surface of the first circuit chip;

a first optical chip having a third electrode and a first optical portion on the front surface of the first optical chip, the rear surface of the first optical chip being affixed to the front surface of the first circuit chip;

a second optical chip having a fourth electrode and a second optical portion on the front surface of the second optical chip, the rear surface of the second optical chip being affixed to the front surface of the second circuit chip;

a first wiring substrate including a first substrate and a first wiring pattern provided on the first substrate, the first substrate having a first aperture portion disposed in a manner that the first optical portion faces the first aperture portion, the first wiring pattern being electrically connected to the first electrode and the third electrode; and a second wiring substrate including a second substrate and a second wiring pattern provided on the second substrate, the second substrate having a second aperture portion disposed in a manner that the second optical portion faces the second aperture portion, the second wiring pattern being electrically connected to the second electrode and the fourth electrode, wherein the first substrate has a first bent portion inclined from the third electrode to the first electrode, wherein the first wiring pattern extends along the first bent portion, wherein the second substrate has a second bent portion inclined from the second electrode to the fourth electrode, and wherein the second wiring pattern extends along the second bent portion.

According to still another aspect of the present invention, there is provided an optical module comprising:

a first circuit chip having a first electrode on the front surface of the first circuit chip;

a second circuit chip having a second electrode on the front surface of the second circuit chip, the rear surface of the second circuit chip being affixed to the rear surface of the first circuit chip;

a first optical chip having a third electrode and a first optical portion on the front surface of the first optical chip, the rear surface of the first optical chip being affixed to the front surface of the first circuit chip;

a second optical chip having a fourth electrode and a second optical portion on the front surface of the second optical chip, the rear surface of the second optical chip being affixed to the front surface of the second circuit chip; and a wiring substrate including a substrate, a first wiring pattern provided on the substrate, and a second wiring pattern provided on the substrate, the substrate having a first aperture portion disposed in a manner that the first optical portion faces the first aperture portion and a second aperture portion disposed in a manner that the second optical portion faces the second aperture portion, the first wiring pattern being electrically connected to the first electrode and the third electrode, the second wiring pattern being electrically connected to the second electrode and the fourth electrode, wherein the substrate has a first bent portion inclined from the third electrode to the first electrode and a second bent portion inclined from the second electrode to the fourth electrode;

wherein the first wiring pattern extends along the first bent portion; and wherein the second wiring pattern extends along the second bent portion.

According to a still further aspect of the present invention, there is provided a circuit board on which is mounted any of the above-described optical modules.

According to yet another aspect of the present invention, there is provided an electronic instrument comprising any of the above-described optical modules.

According to a yet further aspect of the present invention, there is provided a method of fabricating a semiconductor device comprising the steps of:

fixing the rear surface of a first semiconductor chip to the front surface of a second semiconductor chip, the front surface of the first semiconductor chip having a first electrode, the front surface of the second semiconductor chip having a second electrode; and bending a substrate on which is formed an interconnecting pattern between the first electrode and the second electrode, so that the interconnecting pattern is electrically connected to the first electrode and the second electrode.

According to a yet further aspect of the present invention, there is provided a method of fabricating an optical module, the method comprising the steps of:

fixing the rear surface of an optical chip to the front surface of a circuit chip, the front surface of the optical chip having a first electrode and an optical portion, the front surface of the circuit chip having a second electrode;

disposing a wiring substrate including a substrate having an aperture portion and an interconnecting pattern provided on the substrate, so that the aperture portion faces the optical portion; and bending the substrate between the first electrode and the second electrode, so that the interconnecting pattern electrically connected to the first electrode and the second electrode.

DETAILED DESCRIPTION OF THE EMBODIMENT

Figure 1:
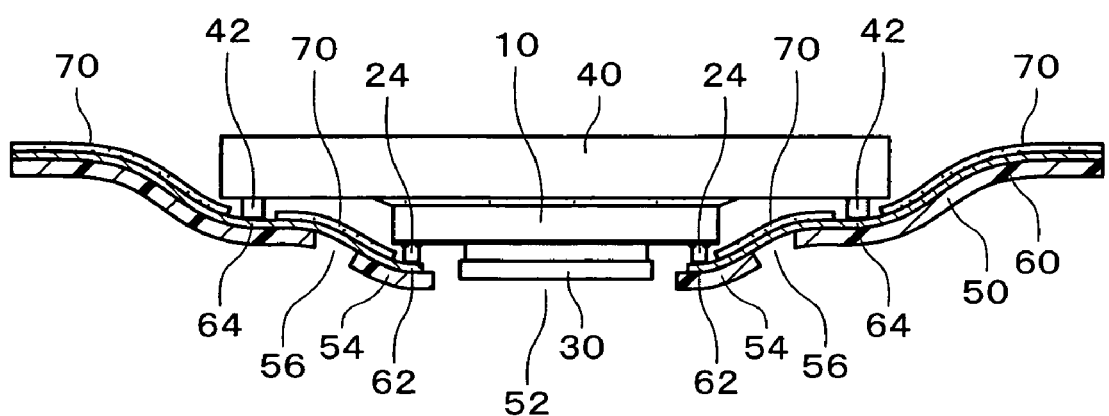
FIG. 1 shows an optical module in accordance with a first embodiment of the present invention.

An objective of this embodiment is to stack a plurality of chips and also make the completed product thinner and smaller.

(1) According to one embodiment of the present invention, there is provided a semiconductor device comprising:

a substrate on which is formed an interconnecting pattern;

a first semiconductor chip provided above the substrate and having a first electrode on a surface facing the substrate; and a second semiconductor chip provided above the first semiconductor chip and having a second electrode on a surface facing the substrate, wherein the substrate has a bent portion inclined from the first electrode to the second electrode, and wherein the interconnecting pattern extends along the bent portion and is electrically connected to the first and second electrodes.

This embodiment enables the interconnecting pattern to electrically connect to the first and second electrodes by bending the substrate. It is therefore possible to provide a thinner and more compact semiconductor device, the size of which is extremely close to that of the stack of semiconductor chips.

(2) In the semiconductor device, a slit may be formed in the bent portion of the substrate so as to extend in a direction crossing the direction from the first electrode to the second electrode.

This makes it possible to form the bent portion of the substrate easily.

(3) In the semiconductor device, a dielectric film that covers the interconnecting pattern may be formed in the bent portion of the substrate.

This makes it possible to prevent the interconnecting pattern from touching the first and second semiconductor chips.

(4) In the semiconductor device, the first electrode may be disposed on an edge portion of the first semiconductor chip.

This makes it possible to prevent the interconnecting pattern from touching the first semiconductor chip.

(5) According to another embodiment of the present invention, there is provided an optical module comprising:

a substrate on which is formed an interconnecting pattern and an aperture portion;

an optical chip provided above the substrate and having an optical portion and a first electrode on a surface facing the substrate, the optical portion being disposed so as to face the aperture portion; and a circuit chip provided above the optical chip and having a second electrode on a surface facing the substrate;

wherein the substrate has a bent portion inclined from the first electrode to the second electrode; and wherein the interconnecting pattern extends along the bent portion and is electrically connected to the first and second electrodes.

This embodiment enables the interconnecting pattern to electrically connect to the first and second electrodes by bending the substrate. It is therefore possible to provide a thinner and more compact optical module, the size of which is extremely close to that of the stack of chips.

(6) In the optical module, a slit may be formed in the bent portion of the substrate so as to extend in a direction crossing the direction from the first electrode to the second electrode.

This makes it possible to form the bent portion of the substrate easily.

(7) In the optical module, a dielectric film that covers the interconnecting pattern may be formed in the bent portion of the substrate.

This makes it possible to prevent the interconnecting pattern from touching the optical chip and the circuit chip.

(8) In the optical module, the first electrode may be disposed on an edge portion of the optical chip.

This makes it possible to prevent the interconnecting pattern from touching the optical chip.

(9) The optical module may further comprise:

a lens disposed at a distance from the optical portion of the optical chip; and a casing provided so as to hold the lens and also surround at least the optical portion.

(10) According to a further embodiment of the present invention, there is provided an optical module comprising:

a first circuit chip having a first electrode on the front surface of the first circuit chip;

a second circuit chip having a second electrode on the front surface of the second circuit chip, the rear surface of the second circuit chip being affixed to the rear surface of the first circuit chip;

a first optical chip having a third electrode and a first optical portion on the front surface of the first optical chip, the rear surface of the first optical chip being affixed to the front surface of the first circuit chip;

a second optical chip having a fourth electrode and a second optical portion on the front surface of the second optical chip, the rear surface of the second optical chip being affixed to the front surface of the second circuit chip;

a first wiring substrate including a first substrate and a first wiring pattern provided on the first substrate, the first substrate having a first aperture portion disposed in a manner that the first optical portion faces the first aperture portion, the first wiring pattern being electrically connected to the first electrode and the third electrode; and a second wiring substrate including a second substrate and a second wiring pattern provided on the second substrate, the second substrate having a second aperture portion disposed in a manner that the second optical portion faces the second aperture portion, the second wiring pattern being electrically connected to the second electrode and the fourth electrode, wherein the first substrate has a first bent portion inclined from the third electrode to the first electrode, wherein the first wiring pattern extends along the first bent portion, wherein the second substrate has a second bent portion inclined from the second electrode to the fourth electrode, and wherein the second wiring pattern extends along the second bent portion.

This enables the interconnecting patterns to electrically connect to any of the electrodes by bending the substrate. Therefore, it makes it possible to provide a thinner and more compact optical module, the size of which is extremely close to that of the stack of chips. In addition, since the optical portions of the first and second optical chips are disposed in mutually opposite directions, the first and second optical chips can be stacked on top of each other, by way of example, enabling the provision of an optical module that is denser and smaller.

(11) According to still another embodiment of the present invention, there is provided an optical module comprising:

a first circuit chip having a first electrode on the front surface of the first circuit chip;

a second circuit chip having a second electrode on the front surface of the second circuit chip, the rear surface of the second circuit chip being affixed to the rear surface of the first circuit chip;

a first optical chip having a third electrode and a first optical portion on the front surface of the first optical chip, the rear surface of the first optical chip being affixed to the front surface of the first circuit chip;

a second optical chip having a fourth electrode and a second optical portion on the front surface of the second optical chip, the rear surface of the second optical chip being affixed to the front surface of the second circuit chip; and a wiring substrate including a substrate, a first wiring pattern provided on the substrate, and a second wiring pattern provided on the substrate, the substrate having a first aperture portion disposed in a manner that the first optical portion faces the first aperture portion and a second aperture portion disposed in a manner that the second optical portion faces the second aperture portion, the first wiring pattern being electrically connected to the first electrode and the third electrode, the second wiring pattern being electrically connected to the second electrode and the fourth electrode, wherein the substrate has a first bent portion inclined from the third electrode to the first electrode and a second bent portion inclined from the second electrode to the fourth electrode;

wherein the first wiring pattern extends along the first bent portion; and wherein the second wiling pattern extends along the second bent portion.

This enables the interconnecting patterns to electrically connect to any of the electrodes by bending the substrate. Therefore, it makes it possible to provide a thinner and more compact optical module, the size of which is extremely close to that of the stack of chips. In addition, since the optical portions of the first and second optical chips are disposed in mutually opposite directions, the first and second optical chips can be stacked on top of each other, by way of example, enabling the provision of an optical module that is denser and smaller.

(12) In the optical module, the second optical chip may overlap the first optical chip.

(13) The optical module may further comprise:

a first lens disposed at a distance from the optical portion of the first optical chip;

a second lens disposed at a distance from the optical portion of the second optical chip;

a fist casing provided so as to hold the first lens and also surround at least the first optical portion; and a second casing provided so as to hold the second lens and also surround at least the second optical portion.

(14) According to a still further embodiment of the present invention, there is provided a circuit board on which is mounted any of the above-described optical modules.

(15) According to yet another embodiment of the present invention, there is provided an electronic instrument comprising any of the above-described optical modules.

(16) According to a yet further embodiment of the present invention, there is provided a method of fabricating a semiconductor device comprising the steps of:

fixing the rear surface of a first semiconductor chip to the front surface of a second semiconductor chip, the front surface of the first semiconductor chip having a first electrode, the front surface of the second semiconductor chip having a second electrode; and bending a substrate on which is formed an interconnecting pattern between the first electrode and the second electrode, so that the interconnecting pattern is electrically connected to the first electrode and the second electrode.

This embodiment enables the interconnecting pattern to electrically connect to the first and second electrodes by bending the substrate. It is therefore possible to provide a thinner and more compact semiconductor device, the size of which is extremely close to that of the stack of semiconductor chips.

(17) In the method of fabricating a semiconductor device, after the interconnecting pattern has been connected electrically to the first electrode, the interconnecting pattern may be electrically connected to the second electrode.

This makes it easy to ensure the length of the bent portion of the substrate, enabling the interconnecting pattern to reliably connect to the first and second electrodes electrically.

(18) According to a yet further embodiment of the present invention, there is provided a method of fabricating an optical module, the method comprising the steps of:

fixing the rear surface of an optical chip to the front surface of a circuit chip, the front surface of the optical chip having a first electrode and an optical portion, the front surface of the circuit chip having a second electrode;

disposing a wiring substrate including a substrate having an aperture portion and an interconnecting pattern provided on the substrate, so that the aperture portion faces the optical portion; and bending the substrate between the first electrode and the second electrode, so that the interconnecting pattern electrically connected to the first electrode and the second electrode.

This embodiment enables the interconnecting pattern to electrically connect to the first and second electrodes by bending the substrate. It is therefore possible to provide a thinner and more compact optical module, the size of which is extremely close to that of the stack of chips.

(19) In the method of fabricating an optical module, after the interconnecting pattern has been connected electrically to the first electrode, the interconnecting pattern may be electrically connected to the second electrode.

This makes it easy to ensure the length of the bent portion of the substrate, enabling the interconnecting pattern to reliably connect to the first and second electrodes electrically.

Embodiments of the present invention are described below with reference to the accompanying figures.

First Embodiment

An optical module in accordance with a first embodiment to which the present invention is applied is shown in FIG. 1. This optical module comprises a plurality of chips (including an optical chip 10 and a circuit chip 40) stacked upon each other and a substrate 50. A section through the optical chip is shown in FIG. 2.

Figure 2:
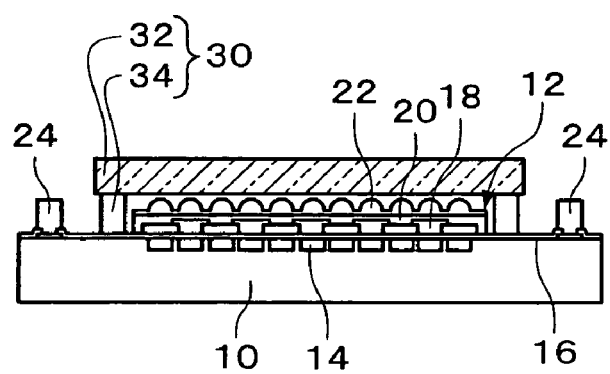
FIG. 2 shows an optical chip which is incorporated in the optical module of the first embodiment of the present invention.

As shown in FIG. 2, the optical chip 10 has an optical portion 12. The optical portion 12 is a portion on which light is incident or from which light is emitted. The optical portion 12 converts between optical energy and another form of energy (such as electrical). In other words, the optical portion 12 has a plurality of energy conversion elements (light-receiving elements or light-emitting elements) 14. In this embodiment, the optical portion 12 is a light-receiving portion. The plurality of energy conversion elements (light-receiving elements or image sensor elements) 14 are arrayed in a two-dimensional manner so as to perform image sensing. In other words, with this embodiment, the optical module is an image sensor (such as a CCD, CMOS, or VMIS sensor). The energy conversion elements 14 are covered by a passivation film 16. The passivation film 16 has optical transmissivity. If the optical chip 10 is fabricated from a semiconductor substrate (such as a semiconductor wafer), the passivation film 16 could be formed of $SiO_2$ or SiN.

The optical portion 12 could have a color filter 18. The color filter 18 is formed over the passivation film 16. An evening layer 20 is provided over the color filter 18 and a micro-lens array 22 could be provided thereover.

The optical chip 10 could be formed as a right-angled parallelepiped (a rectangle in plan). A plurality of first electrodes 24 are formed on the optical chip 10. The first electrodes 24 could have bumps formed on pads, or they could be pads alone. The first electrodes 24 are formed on outer sides of the optical portion 12. The first electrodes 24 could be disposed on edge portions (such as two opposite edges or all four edges) of the optical chip 10.

The optical portion 12 could be sealed by a sealing portion 30. This would make it possible to protect the optical portion 12 from humidity and also prevent dirt from entering the optical portion 12. The sealing portion 30 has optical transmissivity and is provided to avoid the first electrodes 24. The sealing portion 30 could have a plate portion 32 disposed above the optical portion 12 and a spacer portion 34 formed continuously around the optical portion 12, by way of example. The plate portion 32 could be transmissive of light of a specific wavelength only; for instance, it could pass visible light but block light from the infrared region. A sealed space is formed between the plate portion 32 and optical portion 12. This space could be at a reduced pressure below that of atmospheric pressure, or it could be at a vacuum, or it could be filled with nitrogen or dry air.

Integrated circuitry (such as circuitry having transistors and memory) is formed on the circuit chip 40, although this is not shown in the figures. The circuit chip 40 is used in processing such as signal processing (A/D conversion, by way of example), before and after the energy conversion for the optical chip 10. If integrated circuitry is formed on the semiconductor substrate, the circuit chip 40 is a semiconductor chip. The circuit chip 40 could be formed as a right-angled parallelepiped (a rectangle in plan). The circuit chip 40 has second electrodes 42. The second electrodes 42 could be disposed on edge portions (such as two opposite edges or all four edges) of the circuit chip 40. As shown in FIG. 1, the second electrodes 42 could have bumps formed on pads, or be pads alone.

As shown in FIG. 1, the circuit chip 40 is provided above the optical chip 10. The circuit chip 40 is stacked above the optical chip 10. More specifically, part of the circuit chip 40 overlays the optical chip 10. The second electrodes 42 are disposed in a region that does not overlay the optical chip 10. The external form of the circuit chip 40 could be larger than the external form of the optical chip 10. The configuration could be such that the optical chip 10 overlays the central portion of the circuit chip 40 and the second electrodes 42 are disposed on edge portions of the circuit chip 40.

The optical module comprises a substrate (or base plate) 50 that can be bent. The substrate 50 is a flexible substrate (such as film or tape). Examples of a flexible substrate include a polyester substrate or a polyimide substrate, by way of example. The substrate 50 could be a substrate for chip-on-film (COF) or tape automated bonding (TAB).

An aperture portion 52 is formed in the substrate 50 in a portion that faces the optical portion 12. The open area of the aperture portion 52 could be the same as the area of the optical portion 12 of the optical chip 10, or it could be smaller or larger than the area of the optical portion 12. In other words, the open area of the aperture portion 52 could be larger than the area of the sealing portion 30.

An interconnecting pattern 60 is formed on the substrate 50. A wiring substrate comprises the substrate 50 and the interconnecting pattern 60. The interconnecting pattern 60 could be formed on one surface of the substrate 50 as shown in FIG. 1 or it could be formed on both surfaces thereof. The interconnecting pattern 60 gathers together a plurality of interconnecting lines that are designed to form an electrical connection between at least two points. The interconnecting pattern 60 could also be a plurality of interconnecting lines for providing predetermined signal processing. The interconnecting pattern 60 could be formed by depositing any one of: copper (Cu), chrome (Cr), titanium (Ti), nickel (Ni), titanium-tungsten (TiW), gold (Au), aluminum (Al), nickel vanadium (NiV), and tungsten (W).

The interconnecting pattern 60 comprises a first electrical connective portion 62 connected to one of the first electrodes 24 of the optical chip 10 and a second electrical connective portion 64 connected to one of the second electrodes 42 of the circuit chip 40. Each of the first and second electrical connective portions 62 and 64 could also be an edge portion of an interconnecting line. Each of the first and second electrical connective portions 62 and 64 could also be part of an interconnecting line or a land.

The optical chip 10 has the optical portion 12 and the first electrodes 24 on the surface facing the substrate 50. The optical portion 12 is disposed in a position that opens from the aperture portion 52 of the substrate 50. The circuit chip 40 is deposited on the surface of the optical chip 10 opposite to the substrate 50. The circuit chip 40 has the second electrodes 42 on the surface towards the substrate 50. In other words, the first and second electrodes 24 and 42 are disposed on the side facing the substrate 50. The end surface (the surface that connects to the second electrical connective portion 64) of each second electrode (such as a bump) 42 and the end surface (the surface that connects to the first electrical connective portion 62) of each first electrode (such as a bump) 24 are disposed at different heights.

The substrate 50 has a bent portion 54 that slopes from the first electrodes 24 to the second electrodes 42. The bent portion 54 is formed in the region between the first and second electrodes 24 and 42. The bent portion 54 could have bends at a plurality of places from the first electrodes 24 to the second electrodes 42, but it may form a smooth bend as shown in FIG. 1. This makes it possible to prevent disconnections of the interconnecting pattern 60 on the substrate 50. The bent portion 54 may not be connected to the optical chip 10 and the circuit chip 40.

The interconnecting pattern 60 extends along the bent portion 54 and is connected electrically to the first and second electrodes 24 and 42. More specifically, one of the first electrodes 24 is connected to the first electrical connective portion 62 and one of the second electrodes 42 is connected to the second electrical connective portion 64. The electrical connections could be by metal bonding or solder bonding. As shown in FIG. 1, a pair of a first electrical connective portion 62 and a second electrical connective portion 64 out of a plurality of the first and second electrical connective portions 62 and 64 could be electrically connected each other.

A slit 56 is formed in the bent portion 54 of the substrate 50. The slit 56 extends in a direction that crosses the direction from the first electrodes 24 to the second electrodes 42. The slit 56 could extend along an edge of either semiconductor chip. The slit 56 could also be a hole (such as a slot) or a cut-out. The formation of the slit 56 makes it possible to facilitate the formation of the bent portion 54 of the substrate 50.

A dielectric film 70 is formed over the substrate 50. The dielectric film 70 covers part of the interconnecting pattern 60. More specifically, the dielectric film 70 is formed to avoid electrical connective portions (such as the first and second electrical connective portions 62 and 64) of the interconnecting pattern 60. The dielectric film 70 is formed in at least the bent portion 54 of the substrate 50. This configuration makes it possible to prevent the interconnecting pattern 60 of the bent portion 54 from contacting the optical chip 10 and the circuit chip 40. It is thus possible to prevent electrical short-circuiting and improve reliability. Note that the dielectric film 70, as shown in FIG. 1, could also be formed over regions other than the bent portion 54.

The bending of the substrate 50 of this embodiment enables electrical contacts between the interconnecting pattern 60 and the first and second electrodes 24 and 42. It is therefore possible to provide a thinner and more compact optical module, the size of which is extremely close to that of the stack of layers. If the first electrodes 24 are formed on edge portions of the optical chip 10, the interconnecting pattern 60 could be prevented from touching corner portions of the optical chip 10. In other words, it makes it possible to prevent edge-shorting, thus enabling an increase in reliability.

The description now turns to a method of fabricating an optical module in accordance with this embodiment. This method of fabricating an optical module comprises the provision of a plurality of chips, including the optical chip 10 and the circuit chip 40, in a stack upon each other on the substrate 50. First of all, the optical chip 10 is mounted on the circuit chip 40. The optical chip 10 could be attached to the central portion of the circuit chip 40 by adhesive 72, by way of example. The first electrodes 24 of the optical chip 10 and the second electrodes 42 of the circuit chip 40 are aligned in same direction.

Figure 3:
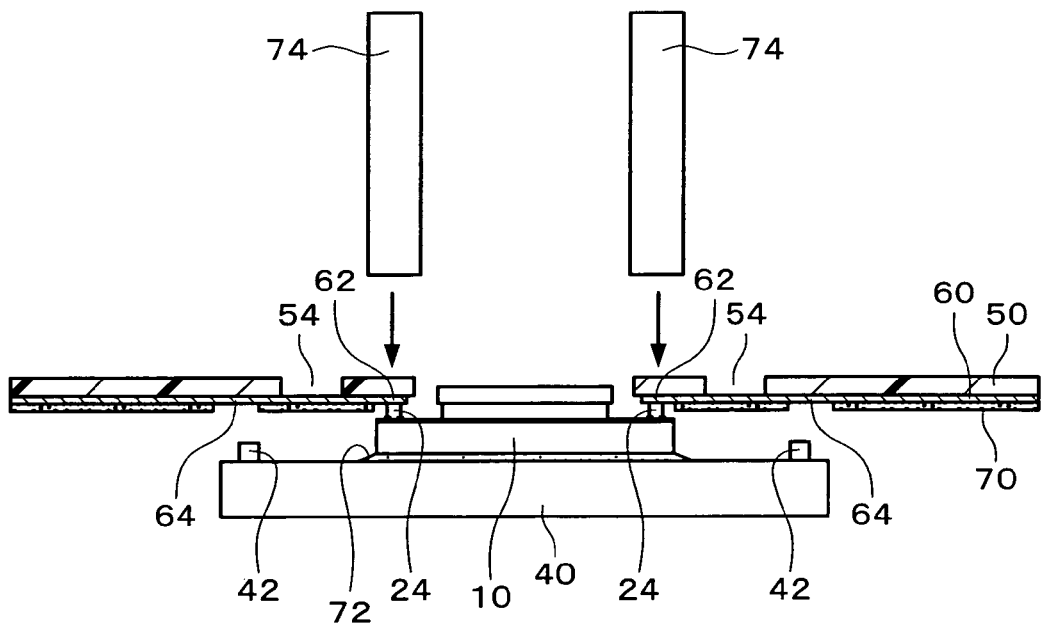
FIG. 3 illustrates a method of fabricating the optical module in accordance with the first embodiment of the present invention.

The substrate 50 is then bent so that it is inclined from the first electrodes 24 to the second electrodes 42, so that the interconnecting pattern 60 comes into electrical contact with the first and second electrodes 24 and 42. After the first electrical connective portion 62 of the interconnecting pattern 60 has been connected to the corresponding first electrode 24, the substrate 50 may be bent so that the second electrical connective portion 64 comes into contact with the corresponding second electrode 42, as shown in FIG. 3. This makes it easy to ensure the length of the bent portion 54 of the substrate 50, enabling reliable electrical contact between the interconnecting pattern 60 and the first and second electrodes 24 and 42. The electrical connections could be achieved by using bonding tools 74 to apply heat and pressure from the substrate 50 side. The rest of the configuration is as described previously, so further details are omitted.

The present invention is not limited to the above-described embodiment and thus various modifications thereto are possible. In the description below (including that of the second and third embodiments), all items that are in common with other examples and are conceivable (such as the configuration, operation, function, and effects thereof) are omitted. Note that the present invention also comprises items that are achieved by combining a plurality of examples.

Figure 4:
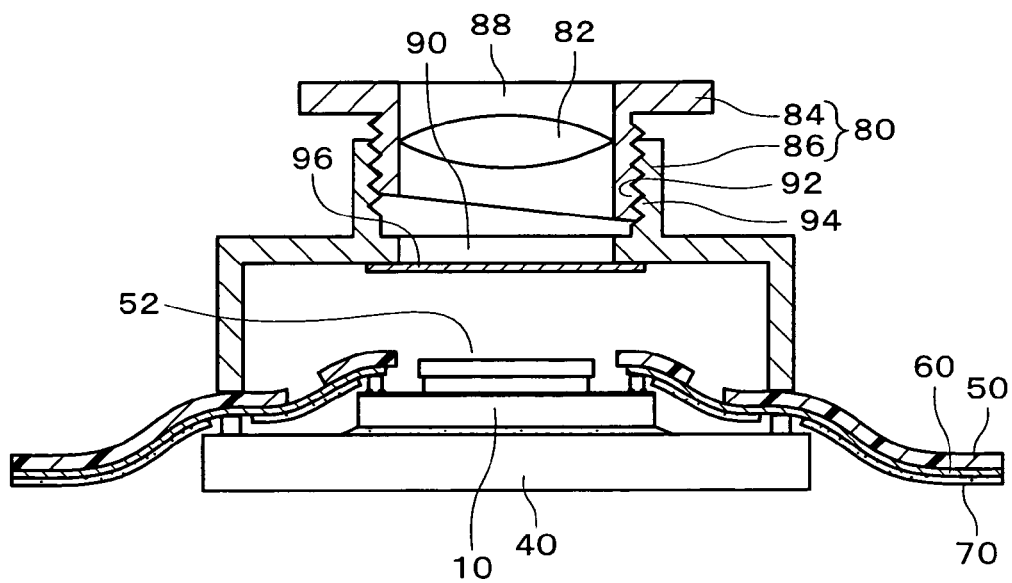
FIG. 4 shows an optical module in accordance with a variant example of the first embodiment of the present invention.

In a variant example shown in FIG. 4, the optical module comprises a casing 80 and a lens 82. The casing 80 could be a case for the optical chip 10. The casing 80 could be a lens-barrel. In the example shown in FIG. 4, the casing 80 is attached to the substrate 50. More specifically, the casing 80 is provided in such a manner that it surrounds at least the optical portion 12 (the sealing portion 30). The fixing of the casing 80 could be done by using an adhesive.

The lens 82 is fixed to the casing 80. If the casing 80 and the lens 82 are used for capturing images, they can be called an image-capturing optical system. The lens 82 is disposed at a position corresponding to the optical portion 12 of the optical chip 10. The casing 80 comprises a first portion 84 that acts as a lens holder and a second portion 86 that acts as an attachment to the substrate 50. The lens 82 is attached to the first portion 84. First and second aperture portions 88 and 90 are formed in the first and second portions 84 and 86, respectively, above the optical portion 12. The first and second aperture portions 88 and 90 are connected. The lens 82 is attached within the first aperture portion 88 of the first portion 84. The lens 82 could be fixed within the first aperture portion 88 by a pressing mechanism (not shown in the figure) comprising a pressing device that enables movement in the direction along the axis of the first aperture portion 88, using a screw thread (not shown in the figure) formed on the inner side of the first portion 84. The lens 82 is held at a distance from the optical portion 12 of the optical chip 10. First and second screw threads 92 and 94 are formed in the outer side of the first portion 84 and the inner side of the second aperture portion 90 of the second portion 86, and the first and second portions 84 and 86 are connected thereby. Thus the first and second screw threads 92 and 94 ensure that the first and second portions 84 and 86 can move in the direction along the axis of the first and second aperture portions 88 and 90. This enables adjustment of the focusing of the lens 82. Note that the second portion 86 of the casing 80 could also be provided with a filter 96 so as to block the second aperture portion 90. The filter 96 could be transmissive of light of a specific wavelength only; for instance, it could pass visible light but block light from the infrared region.

In the example shown in FIG. 4, the second portion 86 supports the electrodes 42 of the circuit board chip 40, via the substrate 50. In other words, the casing 80 is provided so as to surround the optical chip 10. Alternatively, the second portion 86 could support the outer side of the optical portion 12 of the optical chip 10. In other words, the casing 80 is provided so as to surround the optical portion 12. In such a case, the second portion 86 could be disposed in a region within the aperture portion 52 of the substrate 50. Alternatively, the second portion 86 could equally well be provided so as to surround the optical chip 10 and the optical portion 12.

Figure 5:
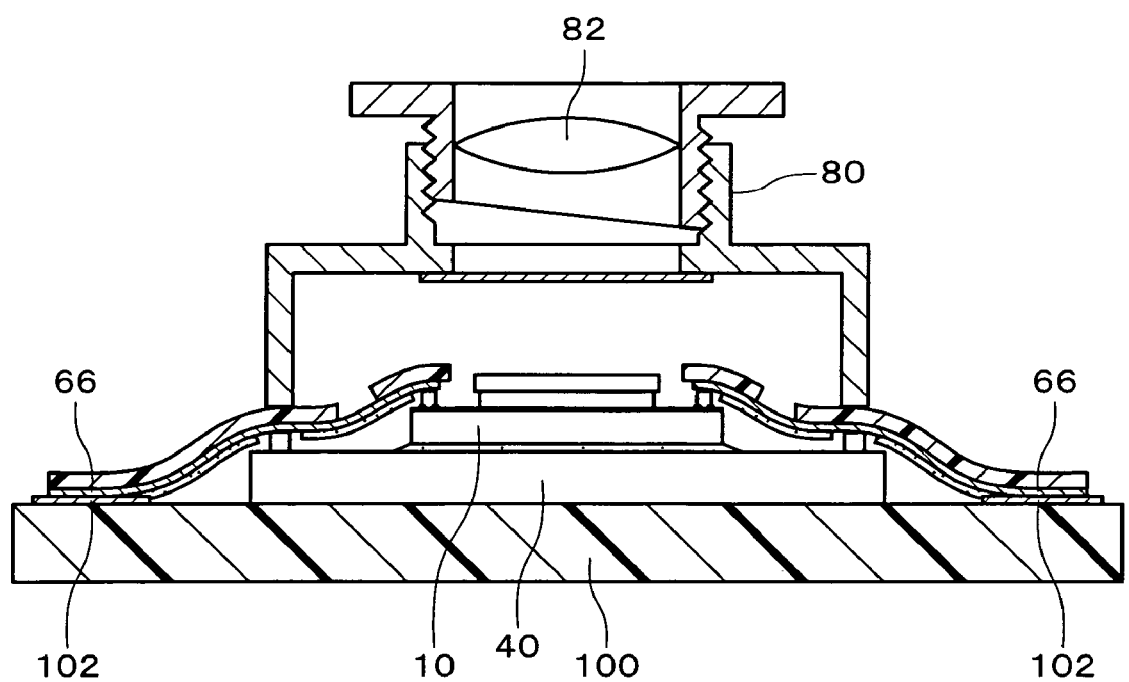
FIG. 5 shows a circuit board in accordance with the first embodiment of the present invention.

In a variant example shown in FIG. 5, the optical module of FIG. 4 is mounted on a circuit board. External pins are formed in the substrate 50. Electrical connection to a circuit board 100 (such as a motherboard) could be provided through these external pins. The external pins could be a third electrical connective portion 66 of the interconnecting pattern 60. The third electrical connective portion 66 is connected electrically to an interconnecting pattern 102 formed on the circuit board 100. Electronic components other than the optical module could also be mounted on the circuit board 100.

Second Embodiment

Figure 6:
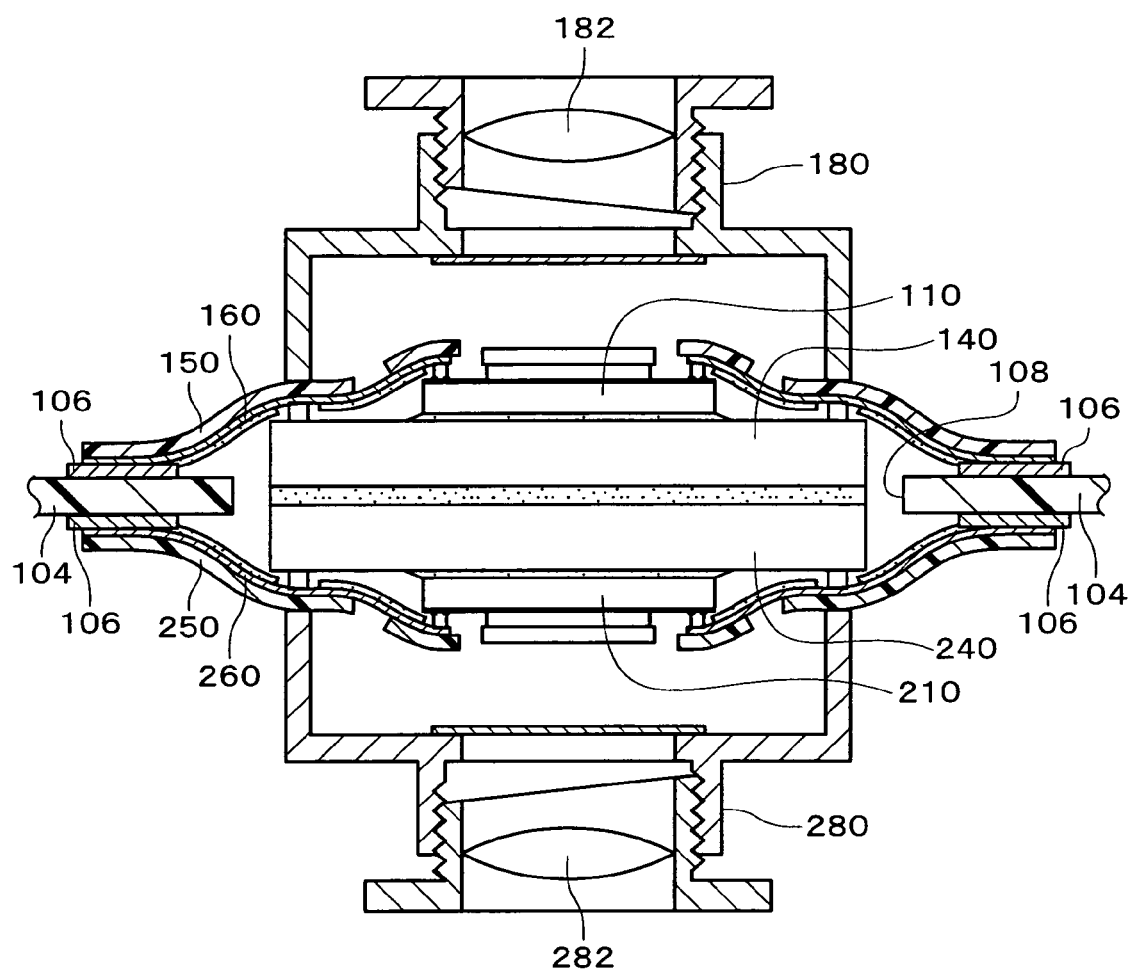
FIG. 6 shows an optical module in accordance with a second embodiment of the present invention.

An optical module in accordance with a second embodiment to which the present invention is applied is shown in FIG. 6. In the optical module in accordance with this embodiment, a first optical chip 110 and a first circuit chip 140 are connected electrically to a first wiring pattern 160 of a first portion 150, and a second optical chip 210 and a second circuit chip 240 are connected electrically to a second wiring pattern 260 of a second portion 250. A first casing 180 and a first lens 182 are provided on the first portion 150 side and a second casing 280 and a second lens 282 are provided on the second portion 250 side. In the example shown in FIG. 6, the first and second portions 150 and 250 are each configured as separate bodies and can be called first and second substrates, respectively. Note that further details can be taken from the substrate 50, the optical chip 10, the circuit chip 40, the casing 80, and the lens 82 that were previously described with reference to the first embodiment.

The optical portions 12 of the first and second optical chips 110 and 210 are disposed to face in mutually opposite directions. In other words, the surface of the first optical chip 110 on which the optical portion 12 is formed faces in the opposite direction from the surface of the second optical chip 210 on which that optical portion 12 is formed. In the example shown in FIG. 6, the first and second optical chips 110 and 210 are disposed so that the two optical portions 12 do not face each other (they are directed outward). This makes it possible to ensure that the paths along which light is incident on the optical portions 12 or emitted therefrom are outwards.

The first and second portions 150 and 250 are disposed so as to overlay each other. The first and second optical chips 110 and 210 are disposed in such a manner that at least parts thereof (a part of each, a part of one and all of the other, or all of both) overlap. In other words, one of the first and second optical chips 110 and 210 is disposed above the other. The first and second circuit chips 140 and 240 are also disposed in such a manner that at least parts thereof (a part of each, a part of one and all of the other, or all of both) overlap. The first and second circuit chips 140 and 240 could be fixed together with adhesive or the like on the rear surfaces thereof, by way of example. In the example shown in FIG. 6, the optical modules of FIG. 4 are disposed one above the other, in a symmetrical configuration. In other words, the rear surface of the first optical chip 110 (the surface opposite to that on which electrodes are formed) is affixed to the surface of the first circuit chip 140 and the rear surface of the second optical chip 210 (the surface opposite to that on which electrodes are formed) is affixed to the surface (the surface on which the electrodes are formed) of the second circuit chip 240.

A circuit board 104 is interposed between the first and second portions 150 and 250. An interconnecting pattern 106 is formed on each surface of the circuit board 104, in such a manner that it is connected to the first and second wiring patterns 160 and 260.

In the example shown in FIG. 6, the circuit board 104 has an aperture portion 108 and the stack of the plurality of chips is disposed within the aperture portion 108. Since this makes it possible to omit the thickness of the circuit board 104, it enables a thinner and also more compact configuration.

Figure 7:
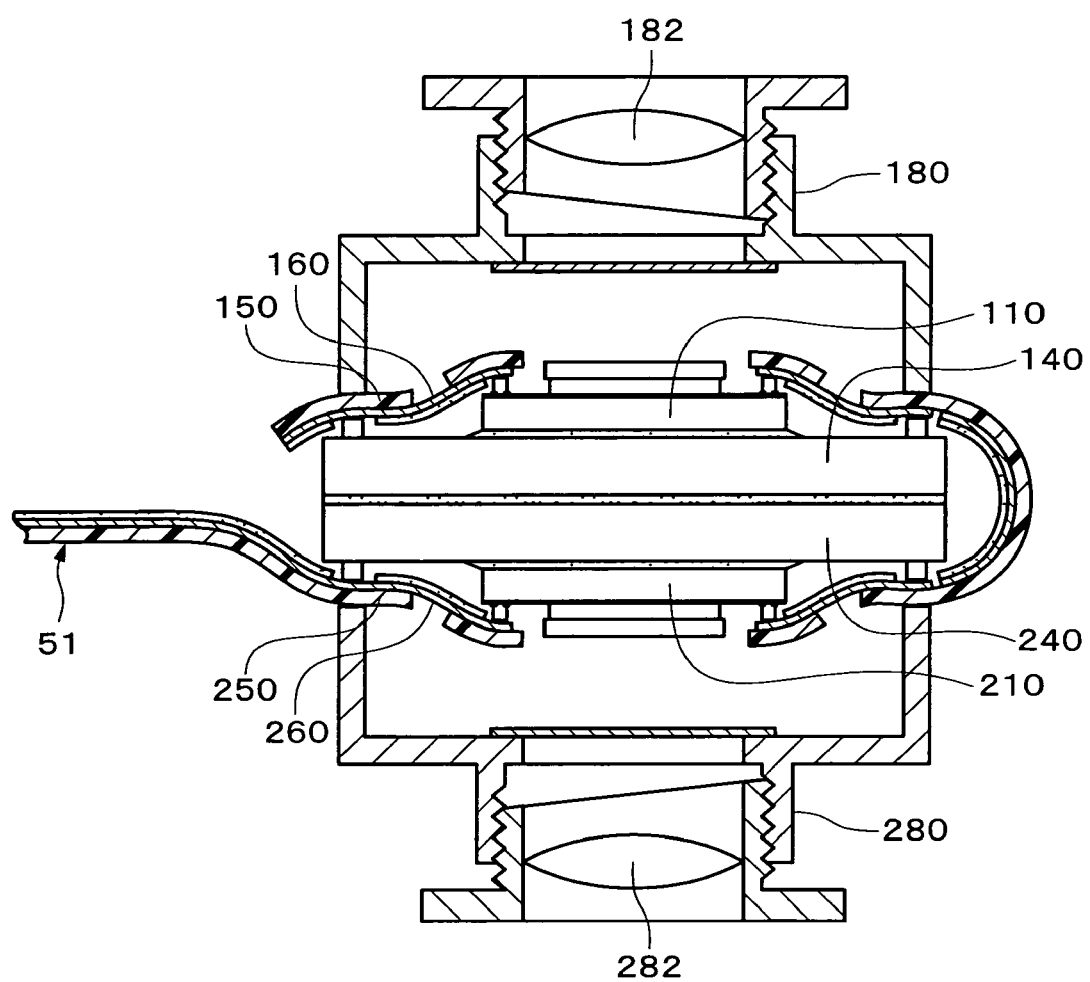
FIG. 7 shows an optical module in accordance with a variant example of the second embodiment of the present invention.

In another variant example shown in FIG. 7, the first and second portions 150 and 250 could be configured as an integral base plate. In other words, a substrate 51 comprises the above-described first and second portions 150 and 250 and it bends between the first and second portions 150 and 250. The first and second portions 150 and 250 overlap each other. Part of the plan layout of the substrate 51 could be overlaid or all thereof. The first and second wiring patterns 160 and 260 are formed on the inner side of a portion that is overlaid by the substrate 51. In this variant example, the first and second portions 150 and 250 are formed by an integral base plate, making it possible to fabricate an optical module by bending the substrate 51 after a plurality of chips have been mounted thereon. The handling of the assembly is therefore made easier, simplifying the fabrication process.

Third Embodiment

Figure 8:
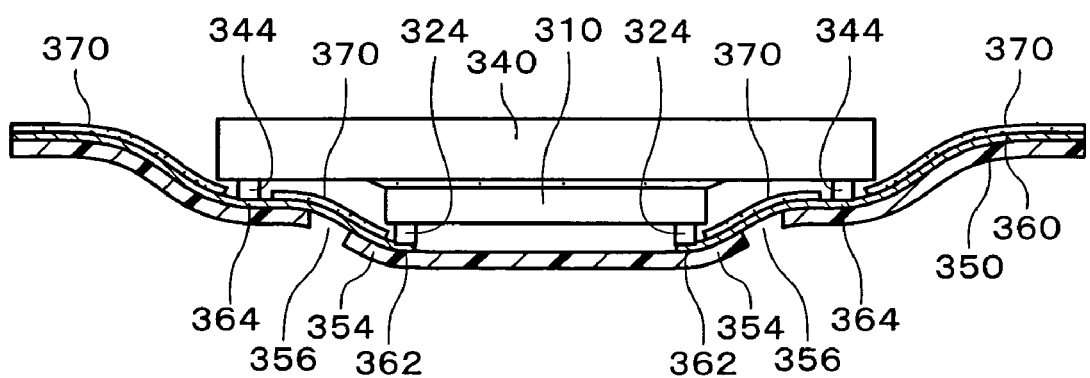
FIG. 8 shows a semiconductor device in accordance with a third embodiment of the present invention.

A semiconductor device in accordance with a third embodiment to which the present invention is applied is shown in FIG. 8. This semiconductor device comprises a plurality of chips (first and second semiconductor chips 310 and 340) stacked upon each other and a substrate 350.

The first and second semiconductor chips 310 and 340 each have integrated circuitry and can be called circuit chips. The first and second semiconductor chips 310 and 340 have first and second electrodes 324 and 344, respectively. The first electrodes 324 are disposed along edge portions of the first semiconductor chip 310 and the second electrodes 344 are disposed along edge portions of the second semiconductor chip 340. The rest of the configuration can be taken from details of the above-described optical chip 10 and circuit chip 40.

The substrate 350 could have a configuration similar to that of the above-described substrate 50, except for the aperture portion, and an interconnecting pattern 360 is formed thereon. A bent portion 354 of the substrate 350 could have a slit 356 formed therein. Note that a dielectric film 370 is formed over the substrate 350 to cover part of the interconnecting pattern 360.

The first and second semiconductor chips 310 and 340 are mounted in a face-down orientation with respect to the substrate 350. A first electrical connective portion 362 of an interconnecting pattern 370 is connected to the first electrodes 324 and a second electrical connective portion 364 thereof is connected to the second electrodes 344. The above-described effects can be achieved by this embodiment also. Note that the method of fabricating a semiconductor device in accordance with this embodiment can be deduced from the above-described method of fabricating an optical module so further description is omitted.

Figure 9A:
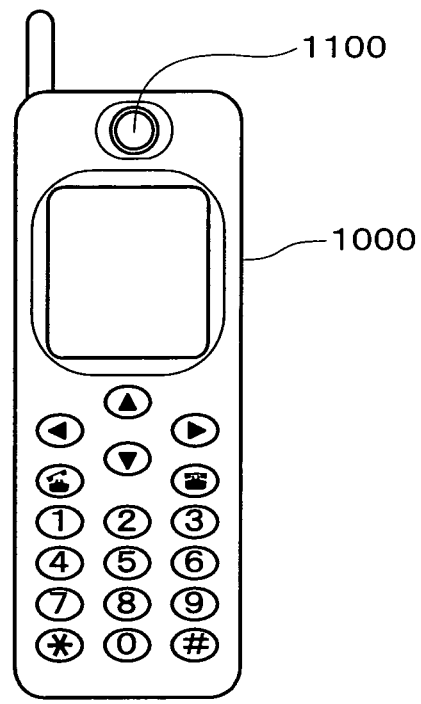
FIGS. 9A and 9B show an electronic instrument in accordance with an embodiment of the present invention.
Figure 9B:
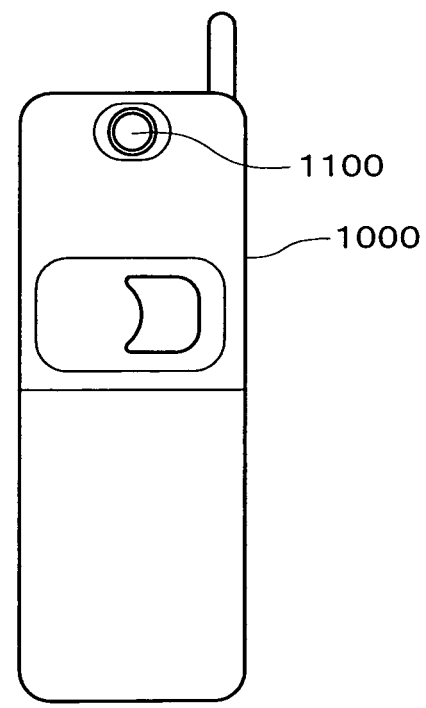

A mobile phone 1000 shown in FIGS. 9A and 9B is illustrative of an electronic instrument having the optical module in accordance with this embodiment of the present invention. The mobile phone 1000 has a camera 1100 in which is incorporated the above-described optical module. The camera 1100 is configured to be capable of capturing images from both the front surface and the rear surface of the mobile phone.

The present invention is not limited to the above-described embodiments and thus various modifications thereto are possible. For example, the present invention comprises configurations that are substantially the same as the configurations described as embodiments herein (such as configurations having the same function, method, and effects, or having the same objectives and effects, by way of example). The present invention also comprises configurations in which portions that are not essential parts of the configurations described with reference to the embodiments are replaced with others. The present invention further comprises configurations such that known technology is added to the configurations described with reference to embodiments herein.

What is claimed is:

1. An optical module comprising:
   a first circuit chip having a first electrode on the front surface of the first circuit chip;
   a second circuit chip having a second electrode on the front surface of the second circuit chip, the rear surface of the second circuit chip being affixed to the rear surface of the first circuit chip;
   a first optical chip having a third electrode and a first optical portion on the front surface of the first optical chip, the rear surface of the first optical chip being affixed to the front surface of the first circuit chip;
   a second optical chip having a fourth electrode and a second optical portion on the front surface of the second optical chip, the rear surface of the second optical chip being affixed to the front surface of the second circuit chip;
   a first wiring substrate including a first substrate and a first wiring pattern provided on the first substrate, the first substrate having a first aperture portion disposed in a manner that the first optical portion faces the first aperture portion, the first wiring pattern being electrically connected to the first electrode and the third electrode; and
   a second wiring substrate including a second substrate and a second wiring pattern provided on the second substrate, the second substrate having a second aperture portion disposed in a manner that the second optical portion faces the second aperture portion, the second wiring pattern being electrically connected to the second electrode and the fourth electrode,
   wherein the first substrate has a first bent portion inclined from the third electrode to the first electrode,
   wherein the first wiring pattern extends along the first bent portion,
   wherein the second substrate has a second bent portion inclined from the second electrode to the fourth electrode, and
   wherein the second wiring pattern extends along the second bent portion.

2. The optical module as defined by claim 1, wherein the second optical chip overlaps the first optical chip.

3. The optical module as defined by claim 1, further comprising:
   a first lens disposed at a distance from the optical portion of the first optical chip;
   a second lens disposed at a distance from the optical portion of the second optical chip;
   a first casing provided so as to hold the first lens and also surround at least the first optical portion; and
   a second casing provided so as to hold the second lens and also surround at least the second optical portion.

4. A circuit board on which is mounted the optical module as defined by claim 1.

5. An electronic instrument comprising the optical module as defined by claim 1.

6. An optical module comprising:
   a first circuit chip having a first electrode on the front surface of the first circuit chip;
   a second circuit chip having a second electrode on the front surface of the second circuit chip, the rear surface of the second circuit chip being affixed to the rear surface of the first circuit chip;
   a first optical chip having a third electrode and a first optical portion on the front surface of the first optical chip, the rear surface of the first optical chip being affixed to the front surface of the first circuit chip;
   a second optical chip having a fourth electrode and a second optical portion on the front surface of the second optical chip, the rear surface of the second optical chip being affixed to the front surface of the second circuit chip; and
   a wiring substrate including a substrate, a first wiring pattern provided on the substrate, and a second wiring pattern provided on the substrate, the substrate having a first aperture portion disposed in a manner that the first optical portion faces the first aperture portion and a second aperture portion disposed in a manner that the second optical portion faces the second aperture portion, the first wiring pattern being electrically connected to the first electrode and the third electrode, the second wiring pattern being electrically connected to the second electrode and the fourth electrode, wherein the substrate has a first bent portion inclined from the third electrode to the first electrode and a second bent portion inclined from the second electrode to the fourth electrode;

wherein the first wiring pattern extends along the first bent portion; and wherein the second wiring pattern extends along the second bent portion.

7. The optical module as defined by claim 6, wherein the second optical chip overlaps the first optical chip.

8. The optical module as defined by claim 6, further comprising:

a first lens disposed at a distance from the optical portion of the first optical chip:

a second lens disposed at a distance from the optical portion of the second optical chap;

a first casing provided so as to hold the first lens and also surround at least the first optical portion; and a second casing provided so as to hold the second lens and also surround at least the second optical portion.

9. A circuit board on which is mounted the optical module as defined by claim 6.

10. An electronic instrument comprising the optical module as defined by claim 6.

* * * * *